United States Patent [19]
Ito et al.

[11] Patent Number: 5,699,035
[45] Date of Patent: Dec. 16, 1997

[54] ZNO THIN-FILM VARISTORS AND METHOD OF MAKING THE SAME

[75] Inventors: Takeshi Ito, Colorado Springs, Colo.; Shuzo Hiraide, Tokyo, Japan; Michael C. Scott, Colorado Springs, Colo.; Carlos A. Paz de Araujo, Colorado Springs, Colo.; Larry D. McMillan, Colorado Springs, Colo.

[73] Assignee: Symetrix Corporation, Colorado Springs, Colo.

[21] Appl. No.: 408,723

[22] Filed: Mar. 22, 1995

Related U.S. Application Data

[63] Continuation-in-part of Ser. No. 134,493, Oct. 8, 1993, which is a continuation of Ser. No. 807,439, Dec. 13, 1991.

[51] Int. Cl.$^6$ ........................................ H01C 7/10
[52] U.S. Cl. ........................................ 338/21; 338/20
[58] Field of Search ........................................ 338/20, 21

[56] References Cited

U.S. PATENT DOCUMENTS

| | | | |
|---|---|---|---|
| 2,773,250 | 12/1956 | Aigrain et al. | 340/173 |
| 3,768,058 | 10/1973 | Harnden, Jr. | 338/20 |
| 3,906,462 | 9/1975 | Feinleib et al. | 340/173 |
| 3,953,371 | 4/1976 | May | 252/512 |
| 4,041,437 | 8/1977 | Matsuura et al. | 338/35 |
| 4,097,834 | 6/1978 | Mar et al. | 338/21 |

(List continued on next page.)

FOREIGN PATENT DOCUMENTS

WO94/10084  5/1994  WIPO.

OTHER PUBLICATIONS

Subbarao, E.C.; Ferroelectricity in Mixed Bismuth Oxides with Layer–Type Structure; Westinghouse Research Laboratories; Pittsburgh, PA.

Subbarao, E.C.; A Family of Ferroelectric Bismuth Compounds; 1962; J. Phys. Chem. Solids; Pergamon Press; vol. 23; pp. 665–676.

(List continued on next page.)

*Primary Examiner*—Teresa J. Walberg
*Assistant Examiner*—Karl Easthom
*Attorney, Agent, or Firm*—Duft, Graziano & Forest, P.C.

[57] ABSTRACT

A thin-film zinc oxide varistor (10) for use in integrated circuits and the like is produced by applying a polyoxyalkylated metal complex, such as a metal alkoxycarboxylate, to a substrate (12, 14, and 16) for the formation of a dried nonohmic layer (18). The method of production includes the steps of providing a substrate and a precursor solution including a polyoxyalkylated zinc complex (P22, P24), coating a portion of the substrate with the precursor solution (P26), drying the coated substrate (P32), and crystallizing the dried thin-film zinc oxide layer (P30). The resultant crystalline zinc oxide varistor layer (18) may be doped with bismuth, yttrium, praseodymium, cobalt, antimony, manganese, silicon, chromium, titanium, potassium, dysprosium, cesium, cerium, and iron to provide a nonohmic varistor. The varistor layer (10) is annealed at a temperature ranging from about 400 to about 1000° C. to provide a layer having a thickness ranging from about 50 nanometers to about 500 nanometers and an average grain size diameter less than about 200 nanometers.

8 Claims, 3 Drawing Sheets

U.S. PATENT DOCUMENTS

| | | | |
|---|---|---|---|
| 4,198,443 | 4/1980 | Pitha | 427/453 |
| 4,250,567 | 2/1981 | Brody | 365/109 |
| 4,272,754 | 6/1981 | Lou | 338/21 |
| 4,297,250 | 10/1981 | Gupta et al. | 252/518 |
| 4,383,237 | 5/1983 | Eda et al. | 338/21 |
| 4,400,683 | 8/1983 | Eda et al. | 338/21 |
| 4,482,841 | 11/1984 | Tiku et al. | 313/503 |
| 4,523,811 | 6/1985 | Ota | 338/20 |
| 4,707,897 | 11/1987 | Rohrer et al. | 29/25.42 |
| 4,727,350 | 2/1988 | Ohkubo | 338/21 |
| 4,729,058 | 3/1988 | Gupta et al. | 361/321.3 |
| 4,736,183 | 4/1988 | Yamazaki et al. | 338/20 |
| 4,917,810 | 4/1990 | Tsunooka et al. | 252/62.9 |
| 5,008,646 | 4/1991 | Hennings et al. | 338/20 |
| 5,024,964 | 6/1991 | Rohrer et al. | 437/47 |
| 5,028,455 | 7/1991 | Miller et al. | 427/126.3 |
| 5,046,043 | 9/1991 | Miller et al. | 365/145 |
| 5,070,385 | 12/1991 | Evans, Jr. et al. | 357/51 |
| 5,089,248 | 2/1992 | Akhtar | 423/604 |
| 5,122,923 | 6/1992 | Matsubara et al. | 361/321 |
| 5,146,299 | 9/1992 | Lampe et al. | 357/23.5 |
| 5,258,738 | 11/1993 | Schat | 338/332 |
| 5,464,990 | 11/1995 | Shirasuki et al. | 257/40 |
| 5,487,918 | 1/1996 | Akhtar | 427/255.3 |

OTHER PUBLICATIONS

Melnick, B.M., et al.; Process Optimization and Characterization of Device Worthy Sol–Gel Based PZT for Ferroelectric Memories; 1990; Ferroelectrics; vol. 109.

Vest, G.M., et al.; Synthesis of Metallo–Organic Compounds for MOD Powders and Films; 1986; Mat. Res. Soc. Symp. Proc.; vol. 60; pp. 35–42.

Shu–Yau Wu; A New Ferroelectric Memory Device, Metal–Ferroelectric–Semiconductor Transistor; IEEE Transactions on Electron Devices; vol. Ed.–21, No. 8; Aug. 1974; pp. 499–504.

Joshi, P.C., et al.; Structural and Optical Properties of Ferroelectric $Bi_4Ti_3O_{12}$ Thin Films by Sol–Gel Technique.

Smolenskii, G.A., et al.; Ferroelectrics of the Oxygen–Octahedral Type with Layered Structure; Sep. 1961; Soviet Physics—Solid State; vol. 3, No. 3; pp. 651–655 and 1435–1437.

Smolenskii, G.A., et al; New Ferroelectrics of Complex Composition.

Smolenskii, G.A.; Ferroelectricity and Related Materials; Chapter 15—Oxygen–Octahedral Ferroelectrics; pp. 670–733.

Smolenskii, G.A., et al.; Dielectric Polarization of a Number of Complex Compounds; submitted Aug. 4, 1958; pp. 1429–1434.

ZNO THIN-FILM VARISTORS AND METHOD OF MAKING THE SAME

RELATED APPLICATIONS

This application is a continuation-in-part of U.S. patent application Ser. No. 08/134,493 filed Oct. 8, 1993, which is a continuation of U.S. patent application Ser. No. 07/807,439 filed Dec. 13, 1991.

BACKGROUND OF THE INVENTION

1. Field of the Invention

The present invention pertains to the field of electrical components and processes for the manufacture thereof. More specifically, the electrical components are thin-film varistors and the process of making these varistors includes the use of liquid polyoxyalkylated metal complexes to deposit a nonohmic thin film metal oxide.

2. Statement of the Problem

Large zinc oxide varistor materials have been produced by mixing zinc oxide and bismuth oxide, molding the mixture, and sintering the mixture. These types of varistors exhibit non-linear current/voltage characteristics between the applied voltage and the current that flows through the material. Specifically, the non-linear current/voltage characteristics can be evaluated by the magnitude of the nonohmic exponent N in the formula $$I=(V/C)^N, \qquad (1)$$

wherein V is the applied voltage, I is the current flowing through the element, and C is a constant. Large zinc oxide varistor are commonly used in power applications to stabilize the voltage of electrical circuits and to absorb voltage surges. These larger varistors typically have a non-ohmic exponent N that exceeds 50, as reported in 72 J. Am. Chem. Soc., (2), 338(1989).

The zinc oxide powder used to form these prior varistors is a high-purity fine powder obtained by the air oxidation of a zinc vapor. In addition to bismuth oxide, it is known to use praseodymium oxide, cobalt oxide, antimony oxide, manganese oxide, silicon oxide, chromium oxide, titanium oxide, and potassium oxide as dopants. These dopant oxides must also be supplied in extremely high purity.

The specific details of the prior manufacturing process for large varistors include mixing the high-purity zinc oxide powder with the solid additive components or dopant oxides, and granulating the mixture. The granules are molded by compression, and sintered. The resultant sintered material is ground and surface-treated. Lead wires are patched and embedded in a resin, in order to complete the manufacture, as reported in 18 Ceramics 935 (No. 11, 1983). The sintering is conducted at a temperature from about 1100° to about 1400° C. The resultant zinc oxide materials typically have crystal grain sizes much greater than 10 µm.

The above-described process cannot be used to manufacture acceptable thin-film varistors of the type that may be utilized in integrated circuits and the like. One insurmountable problem is that the requisite sintering temperature is too great, and produces crystal grains that are excessively large for use in microcircuits. Another problem exists in that heating a semiconductor substrate to a temperature greater than about 1100° C. typically forms a thermal oxidation film on the respective circuit elements that are present on the substrate. Another problem with the high temperature is that numerous elements will undergo thermal diffusion to produce a integrated circuit device having contaminated components. The cracking and peeling of wiring electrodes is also increasingly problematic at elevated temperatures. In the absence of an elevated anneal temperature, the formation of a homogeneously doped zinc oxide thin film is made difficult by prior sputtering techniques that impede a truly randomized distribution of the raw applied metals.

In particular, the large grain sizes that are produced by the prior sintering technique, i.e., crystalline grains having an average diameter greater than about 10 µm, yield a varistor material that is ill-suited for use in thin-film integrated circuit devices. More specifically, the non-linear current/voltage characteristics of zinc oxide varistor materials occur due to a double Schottky barrier that exists at the interface between the zinc oxide crystal grains and the grain boundary dopant oxides. This type of barrier has a dopant oxide bounded by a first zinc oxide crystal grain and a second zinc oxide crystal grain. A conductive zone exists at the intercrystalline boundary, where the dopant oxide resides. This type of barrier necessitates that the crystalline interfaces between the zinc oxide crystal grains and the dopant metal oxide crystals must be present in a stable number, i.e., in an equal distribution in the direction of film thickness. When the crystal grain size or diameter grows to 10 microns, the grains are too large to permit this equal distribution in view of the cell surface area and the film thickness of the zinc oxide thin-film varistor. The absence of an equal grain distribution causes unstable or nonlinear voltage performance characteristics.

SOLUTION TO THE PROBLEM

The invention overcomes the problems that are outlined above by providing, for use in integrated circuits, non-ohmic zinc oxide thin-film varistor materials which have stable voltage performance characteristics, even in layers having a thickness ranging from about 50 nm to about 500 nm. The thin varistor films include small crystal grains having an average particle diameter ranging from about 10 nm to about 300 nm, as compared to a grain diameter of greater than 10 µm for large, power application varistors. These special properties derive from a manufacturing process that utilizes liquid precursor solutions to yield the solid thin-film varistor layer.

Broadly speaking, the invention pertains to materials and processes for producing thin-film varistors having a zinc oxide layer including crystal grain sizes of an average particle diameter less than about 10 µm and, more preferably, less than about 300 nm. These varistors preferably include a wafer or substrate having a thin-film zinc oxide layer operably connected with electrode wiring for use as a varistor. The zinc oxide layer preferably has a thickness ranging from about 50 nm to about 500 nm, and crystal grain sizes having an average particle diameter ranging from about 10 nm to about 300 nm. If the grain diameter is less than about 10 nm, the phenomenon of electron tunnelling typically denies stable electrical performance characteristics to the varistor. On the other hand, if the thin-film grain diameter is greater than about 300 nm, the number of flattened crystal grains parallel to the film thickness direction is correspondingly decreased so that a stable threshold voltage cannot be obtained across the varistor layer.

The thin-film zinc oxides are preferably doped with an oxide of at least one metal element selected from the group consisting of bismuth, yttrium, praseodymium, cobalt, antimony, manganese, silicon, chromium, titanium, potassium, dysprosium, cesium, cerium, and iron. Particularly preferred forms of the invention utilize a bismuth moiety in combination with one or more other members of the group, with yttrium being the most preferred other member. These combinations of metal oxides are preferably combined to form solid solutions having a double Schottky barrier that exhibits nonohmic behavior in thin-films.

The preferred thin-film varistors preferably include a substrate having a first electrode, a second electrode, and a non-ohmic or varistor layer interposed between the first electrode and the second electrode. The nonohmic layer preferably has a thickness less than about 10 microns, and more preferably ranges from 50 nm to 500 nm in thickness. The nonohmic material preferably includes a zinc oxide portion as a majority portion of the material. The nonohmic layer also preferably includes at least one oxide of the dopant metals mentioned above. This dopant preferably has a concentration ranging from 0.01 and 10 mole percent of the total metals. Dibismuth trioxide is a particularly preferred form of bismuth dopant, and diyttrium trioxide is particularly preferred form of yttrium dopant for use in combination with the dibismuth trioxide.

The solid nonohmic metal oxide materials are preferably formed in a liquid deposition process using liquid polyoxyalkylated metal complexes. The polyoxyalkylated metal complexes are most preferably essentially free of water. The substantial absence of water avoids the potentially deleterious effects of polymerizing or viscous gelling of the solution, as well as precipitation of metals from the liquid solution, and significantly extends the shelf life of made-ready precursors to a period exceeding one year or more. The precursors are preferably formed to include a zinc alkoxycarboxylate moiety, wherein the alkoxycarboxylate portion derives from zinc reacting with an alcohol having a carbon number ranging from 4 to 8 and a carboxylate having a carbon number ranging from 4 to 10. The precursor solutions contain a stoichiometrically balanced mixture of various polyoxyalkylated metals in proportions sufficient to yield the desired doped zinc oxide material as described above. In the case of volatile metals, such as bismuth, an approximate 5% to 10% excess molar portion of the volatile metal should be added to compensate for volatilization losses during the manufacturing process.

The thin-film varistors that are described above are preferably produced according to a method including the steps of providing a substrate and a precursor solution including a polyoxyalkylated zinc complex; coating at least a portion of the substrate with the precursor solution to provide a liquid thin-film layer on the substrate; drying the liquid thin-film layer to form a dried thin-film layer; treating the dried thin-film layer to form crystals therein; and adding a second electrode.

The thin-film varistors of the invention preferably include a silicon substrate having a silicon dioxide barrier layer formed thereon, followed by a first electrode. The zinc oxide varistor layer is liquid-deposited on this first electrode, and a second electrode is formed to interpose the varistor layer intermediate the first and second electrodes. Those skilled in the art will understand that, while silicon technology is preferred due to its widespread use, other useful substrates may be utilized such as GaAs, ruby, sapphire and quartz.

While the silicon substrate, silicon dioxide layer, first electrode, and second electrode are formed according to conventional techniques, the zinc oxide varistor layer is formed by a process that makes it suitable for use in integrated circuit devices. Specifically, the liquid precursor solution is applied to the first electrode. The precursor solution preferably includes a polyoxyalkylated metal complex that contains metal moieties in effective amounts for yielding, upon thermal treatment of the precursor solution, a desired composition of the varistor layer.

Other objects, advantages and salient features of the present invention will become apparent from the following detailed description which, when taken into conjunction with the annexed drawings, discloses a number of embodiments of the present invention.

DETAILED DESCRIPTION OF THE INVENTION

Figure 1:
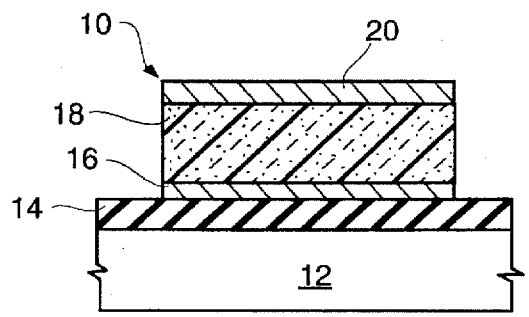
FIG. 1 depicts a sectional, elevational view of a thin-film zinc oxide varistor of the present invention.

FIG. 1 depicts a zinc oxide thin-film varistor 10, which is preferably formed of silicon substrate 12, silicon dioxide ($SiO_2$) isolation layer 14, lower platinum electrode 16, zinc oxide layer 18, and top platinum electrode 20. As will be understood by those skilled in the art, silicon substrate 12 is thermally oxidized according to conventional protocols, e.g., oven baking in an oxygen atmosphere, to form $SiO_2$ isolation layer 14. Lower platinum electrode 16 can be formed by any conventional sputtering technique, e.g., radio frequency or DC magnetron sputtering, as can top platinum electrode 20. Other conductive metals may be substituted for or combined with the platinum in electrodes 16 and 20. Zinc oxide layer 18 is deposited as described below.

Figure 2:
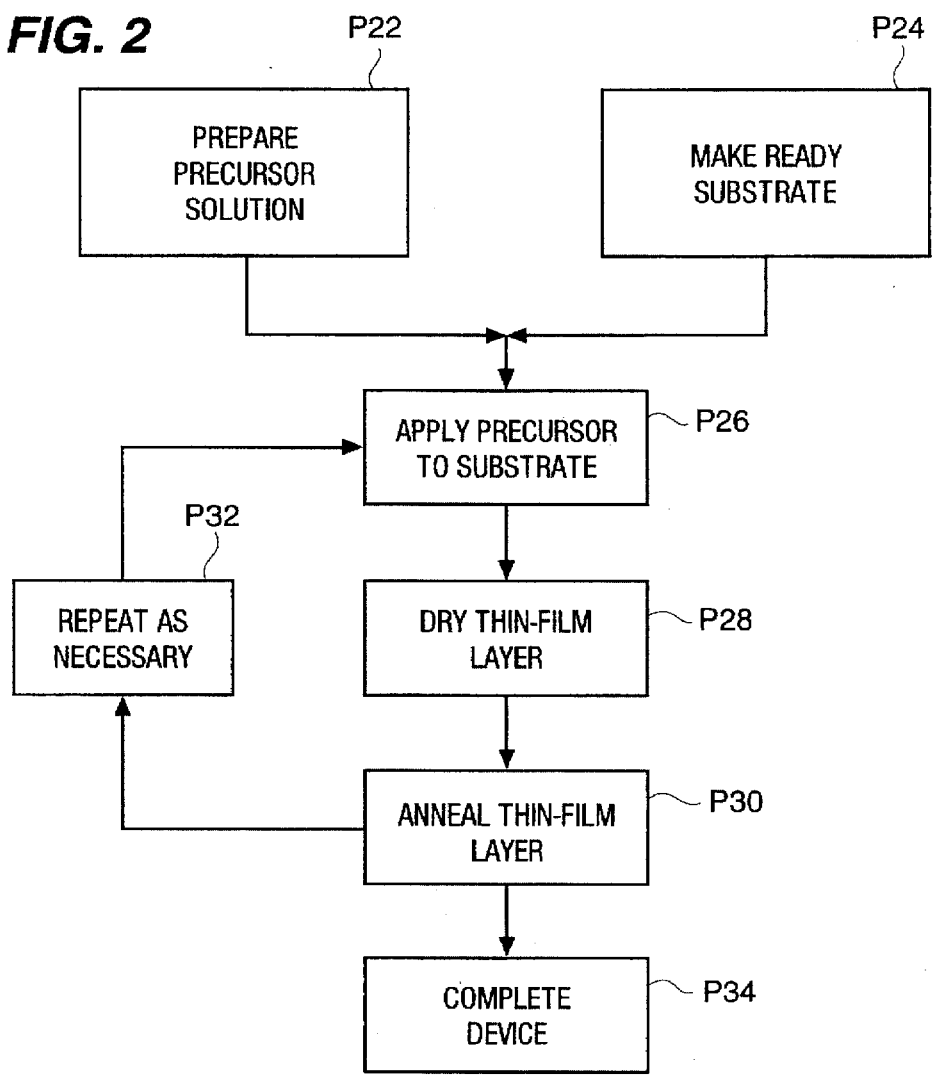
FIG. 2 depicts a process schematic diagram for manufacturing varistors of the type illustrated in FIG. 1.

FIG. 2 depicts a method of manufacturing varistor 10. The method begins with step P22, which preferably includes the preparation of a liquid precursor solution. Liquid precursor solutions that may be utilized in these processes are generally of a type that is described in copending application Ser. No. 08/132,744 filed Oct. 6, 1993, which is hereby incorporated by reference herein to the same extent as though fully disclosed herein.

These precursor solutions include metal alkoxides, metal carboxylates, and metal alkoxycarboxylate complexes. The most preferred precursors include metal alkoxycarboxylates of the form

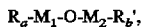

wherein R is an alkoxide ligand, R' is a carboxylate ligand, $M_1$ and $M_2$ are metals, and the subscripts a and b represent units or the corresponding alkoxide ligand R and carboxylate ligand R' that are needed to satisfy the respective valence requirements of metals $M_1$ and $M_2$ defined as the oxidation state of the metal minus one.

The precursors are formed by heating an alcohol with a metal to form a metal alkoxide and adding a carboxylic acid to the heated mixture for purposes of forming a metal alkoxycarboxylate. Of course, these solutions can also include an alkoxide portion, a carboxylate portion, and/or an alkoxycarboxylate portion. Preferred carboxylic acids include hexanoic acids and octanoic acids, and most preferably 2-ethylhexanoic acid. The carboxylic acid selected should have a carbon number ranging from about 4 to 10. The alcohol will typically have a carbon number of about 4–8. The most preferred alcohol is isopropyl alcohol.

The precursor ingredients are selected to provide a stoichiometric balance that will yield a desired thermal metal oxide material upon thermal treatment of the precursor liquid. Zinc is preferably present as a majority of the total metals. Dopant metals, which are also bonded to organic ligands, are preferably added and include bismuth, yttrium, praseodymium, cobalt, antimony, manganese, silicon, chromium, titanium, potassium, dysprosium, cesium, cerium, iron, and mixtures thereof.

Step P24 is conducted to make-ready a substrate for application of a zinc-oxide layer. A conventional silicone wafer or substrate 12 is thermally oxidized by conventional oven baking in oxygen to produce $SiO_2$ isolation layer 14, and first platinum electrode 16 is sputtered into position according to conventional sputtering protocols, e.g., DC magnetron or R.F. sputtering techniques, as will be understood by those skilled in the art.

Step P26 includes applying the liquid precursor of Step P22 atop electrode 16 of Step P24. The precursor application is preferably conducted using a conventional spin-coating machine, such as those used to apply spin-on glass. The spin-coating process includes rotating the partially completed substrate with electrode 16 exposed at the center of the wheel at an angular velocity speed ranging from about 1000 rpm to 2000 rpm. An eyedropper is used to deposit the precursor solution of Step P22 onto electrode 16, with excess liquid being removed through the rotation. A resultant thin-film of liquid precursor solution coats electrode 16, and will be treated to yield solid metal oxide layer 18. Alternatively, the liquid precursor may be applied in a misted-deposition process like that described in application Ser. No. 07/993,380 filed Dec. 18, 1992, which is hereby incorporated by reference herein.

Step P28 includes drying the liquid film of Step P26, preferably, at a temperature ranging from 150° C. to 30020 C. for a period of time ranging from about two minutes to about thirty minutes. This drying step serves to remove most of the precursor solvent, the organic ligands, and any organic contaminants from the liquid solution. A dried metal and metal oxide residue remains on the substrate. The drying step may be split into a sequence of at least two steps that include a first drying at a relatively lower temperature up to 300° C., and a second drying at a relatively higher temperature up to 500° C. For example, the first drying may occur for about thirty seconds in air by heating the substrate with a hot plate to a temperature that preferably ranges up to 300° C., then drying for an additional 5 minutes in air on a hot-plate heated to 500° C. The two-stage drying option serves to enhance the purity of the metal oxide residue that remains on electrode 16 after drying.

Step P30 includes annealing the dried metal oxide residue of Step P28, and is referred to as the first anneal. This annealing step preferably utilizes a rapid thermal processing technique in an oxygen environment, e.g., ultraviolet ("UV") radiation baking in air using a UV source such as a deuterium lamp, a tunable eximer laser, or a Danielson source, A conventional diffusion furnace may also be utilized.

The heat source is preferably used to ramp the temperature of the film 18 at a rate up to 200° C. per second from room temperature up to a plateau temperature ranging from about 400° C. to about 1000° C. for a period of time, inclusive of the ramp time and the plateau holding time, ranging from about five seconds to about fifteen minutes. The maximum holding temperature is more preferably from about 500° C. to about 800° C. Heating to a temperature less than about 400° C. will typically fail to provide sufficient crystallization. Additionally, electrode wiring will begin to break down at temperatures exceeding about 800° C., and thermal diffusion can induce operational problems in the final varistor product. After heating, the substrate is preferably cooled to room temperature by decreasing environmental temperature at a rate having a magnitude exactly opposite the ramped rate of temperature increase.

These annealing process parameters, including the ramp up to a maximum temperature, the selection of a maximum temperature, the duration of holding a maximum temperature, and the rate of cooling may be selectively adjusted for purposes of controlling the size of the crystals that are formed. The plateau temperature is preferably held for a period of time ranging from about fifteen seconds to ten minutes. Thereafter, film 18 is preferably cooled by ramping environmental temperature down to room temperature.

By way of specific example, a maximum temperature of 550° C. for 60 seconds typically produces crystal grains of approximately 20 nm to 30 nm in average diameter. Raising the temperature will provide increasingly smaller crystalline grains, with grains of approximately 10 nm being produced by a maximum temperature of about 650° C.

The high annealing temperature of Step P30 typically removes the solvent and any organic functional group residue that remains in the film after drying; however, a very small amount of organic material will be calcined in situ and introduce carbon as a minor contaminant to the film. The existence of this carbon contamination is not extremely significant, in that it does not prevent the material from functioning as a varistor; however, the presence of carbon residue may slightly alter electrical properties in materials produced according to the invention.

In step P32, the substrate is again subjected to the spin-on deposition of a liquid zinc oxide layer, and the process steps P26 through P30 are repeated as required to increase the thickness of layer 18. The desired thickness preferably ranges from about 50 nm to about 500 nm.

Step P34 includes completing the device, preferably, by sputtering upper electrode 20 atop zinc oxide layer 18, annealing electrode 20, and patterning the device by a conventional photoetching process, which includes the application of a positive resist material followed by ion-etching. After patterning, the entire varistor 10 is preferably annealed once more by heating varistor 10 according to a temperature profile that matches the profile of Step P30.

This process forms a wafer having a plurality of zinc oxide thin-film varistor circuits on a single wafer. Each circuit preferably includes a zinc oxide varistor material having a film thickness less than 200 nm, and in which the size of the zinc crystal grains is less than 500 nm. In more preferred devices, the thickness is preferably less than about 10 microns and grain sizes preferably range from about 50 nm to about 500 nm in combination with crystal grain sizes from about 10 nm to about 300 nm.

The following non-limiting examples set forth preferred materials and methods for practicing the present invention.

EXAMPLE 1

Preparation of a Zinc Oxide Precursor Solution with Bismuth Dopant

A liquid zinc oxide precursor solution was prepared by mixing zinc 2-ethylhexanoate into a 50/50 (v/v) solvent mixture of xylene and butyl acetate to provide a zinc 2-ethylhexanoate concentration of about 0.1 mol/L. Bismuth 2-ethylhexanoate was added to this mixture under a desiccated atmosphere having less than about 40% humidity in a quantity sufficient to produce bismuth concentrations of 0, 0.5, 1, and 5 mole percent bismuth 2-ethylhexanoate. These bismuth concentrations were determined as the number of moles of bismuth 2-ethylhexanoate divided by the number of moles of bismuth 2-ethylhexanoate plus the number of moles of zinc 2-ethylhexanoate, i.e, bismuth as a percentage of total metals.

EXAMPLE 2

Production of a Zinc Oxide Thin-Film Varistor Using a Metal Carboxylate Precursor Solution A standard polycrystalline silicone wafer, i.e., substrate 12, was thermally oxidized by conventional oxygen oven baking to produce $SiO_2$ isolation layer 14, and first electrode 16 was sputtered into position. These steps made-ready the substrate to receive the precursor of Example 1.

Zinc oxide layer 18 was applied in liquid form atop lower platinum electrode 16 using the 5 mole percent bismuth precursor liquid of Example 1 in a spin-coater. The spin-coating operation included rotating the partially completed substrate, with electrode 16 exposed, at about 1500 rpm while dropping the precursor solution of Example 1 onto electrode 16 with an eyedropper. This operation produced a liquid thin-film layer 18 on top of electrode 16.

The liquid film corresponding to layer 18 was heated for 5 minutes in air by heating the substrate to 180° C. with a hot-plate then drying for an additional 5 minutes in air on a hot-plate heated to 300° C. This drying process produced a dried layer 18 having 5% bismuth oxide and 95% zinc oxide atop electrode 16.

The dried layer 18 was annealed according to a rapid thermal processing ("RTP") technique, which utilized UV radiation from a deuterium lamp to heat the sample. This technique included UV baking in an oxygen atmosphere to raise the temperature of the substrate from room temperature to 500° C. at 125° per second, holding the substrate at this 500° C. temperature for 30 seconds, then cooling the substrate to room temperature, all in one oxygen atmosphere. This annealing step produced a crystalline zinc oxide layer 18.

The substrate was again subjected to the spin-on deposition of a liquid zinc oxide layer, dried, and annealed in an identical manner to increase the thickness of layer 18.

The device was completed by sputtering upper electrode 20 atop zinc oxide layer 18, annealing electrode 20 at 500° C. for 30 seconds as before, and patterning the device. Patterning included an ordinary photoetching process, i.e., the application of a positive resist material followed by ion-etching and removal of the remaining resist. After patterning, the entire varistor 10 was RTP annealed a second time for 30 minutes at 550° C. in an oxygen atmosphere.

The patterning served to create a wafer having a plurality of zinc oxide thin-film varistor circuits each including a zinc oxide varistor material having a film thickness ranging between 15 nm and 200 nm, and an average grain diameter of about 300 nm.

As set forth below in Examples 3 and 4, varistor 10 may also be produced by utilizing a sol-gel zinc oxide precursor. This method is less preferred than the carboxylate solution of Examples 1 and 2 due to the corresponding problems that derive from increased viscosity and extremely short shelf life of the made-ready to apply precursor.

EXAMPLE 3

Preparation of a Sol-Gel Zinc Oxide Precursor Solution

A sol-gel precursor solution was prepared by mixing 2-ethoxy ethoxy zinc with 2-ethoxy ethanol to a 0.1 mole/liter 2-ethoxy ethoxy zinc concentration. A quantity of 2-ethoxy ethoxy bismuth was added to the resultant mixture in an amount sufficient to provide a 5 mole percent portion of bismuth determined as a percentage of total solution metals. Water was then added to the bismuth-doped zinc mixture in small portions to a total amount of 1.5 times the molar number of total metal atoms in the precursor solution to be hydrolyzed. The hydrolyzed precursor solution was then filtered with a filter having a mean pore size diameter of about 0.1 μm for immediate application to form layer 18.

EXAMPLE 4

Preparation of a Varistor Using a Sol-Gel Precursor Solution

A standard polycrystalline silicone wafer, i.e., substrate 12, was thermally oxidized by conventional oxygen oven baking to produce $SiO_2$ layer 14, and first electrode 16 was sputtered into position. These steps made-ready the substrate to receive the precursor of Example 3.

Layer 18 was spin-coated for 30 seconds at 1500 rpm with the precursor of Example 3 to form a liquid thin liquid film on the substrate.

The liquid film was dried for 5 minutes in air with a hot plate heated to 180° C., then for an additional 5 minutes on the hot plate heated to 250° C. This drying operation left a dried residue corresponding to thin-film layer 18 having 5% bismuth oxide and 95% zinc oxide.

The dried film layer 18 was annealed to crystallize the zinc oxide material. The varistor was RTP heated in oxygen from room temperature to 450° C. at a rate of 125° C. per second, held at 450° C. for 30 seconds and then cooled to room temperature.

The thickness of layer 18 was increased by repeating the deposition, drying, and annealing steps in the same manner as before.

The varistor was completed by sputtering upper electrode 20 in place, and subjecting the substrate to a crystallization treatment or second anneal for 30 seconds at 500° C., in an oxygen atmosphere. Patterning was performed by a conventional photoetching process, and the product was subjected to a third anneal for 30 minutes at 500° C. in an oxygen atmosphere.

This process produced a zinc oxide thin-film varistor having a film thickness ranging between about 60 nm to 180 nm, and in which the size of the zinc crystal grains were about 300 nm.

EXAMPLE 5

Preparation of a Yttrium-Doped Zinc Oxide Varistor

An aliquot of the 5% bismuth liquid precursor solution, which was prepared in Example 1, was mixed with 1 mole percent (total metal basis) yttrium 2-ethylhexanoate as a dopant.

A process of manufacturing a varistor was begun, as described in Example 2, by making ready a substrate for liquid deposition, and applying the precursor solution including a yttrium dopant by spin-coating. The spin-coating step left a thin-film liquid layer that was subsequently dried in an oxygen atmosphere on a hot plate at 220° C. for 5 minutes, and at 270° C. for 5 minutes. This drying step left a dried zinc oxide layer 18, which was subjected to a first RTP anneal at 525° C. in an oxygen atmosphere for 30 seconds. A second liquid film of the precursor solution was applied, dried, and annealed as before. After the second deposition, the substrate was RTP annealed at 550° C. for 60 minutes in oxygen ($O_2$). The resultant varistor was completed by sputtering electrode 20 atop layer 18, patterning, and annealing as in Example 3.

EXAMPLE 6

Preparation of Yttrium and Bismuth Doped Zinc Oxide Varistors

Additional varistors were produced in an identical manner with respect to Example 5, but differing with regard to the precursor concentrations of bismuth and/or yttrium dopant moieties mixed with zinc. Specifically, the dopant concentrations included six mole percent bismuth in addition to zero, one, two, and three mole percent yttrium (total metal basis). Other comparative dopant concentrations included one mole percent yttrium in addition to bismuth concentrations of zero, two, four, and six mole percent. Samples were also prepared using one, three, and five mole percent yttrium, respectively, as a dopant. Another comparative group of samples was prepared to include zero, one-half, one and five mole percent bismuth, respectively, as a dopant. The resultant varistors were each subjected to conductivity measurements using a Hewlett Packard 4145A picoampmeter. The results are depicted in FIGS. 3 to 5, which each include a Y-axis representing log (current) plotted against an X-axis representing log (voltage).

Figure 3:
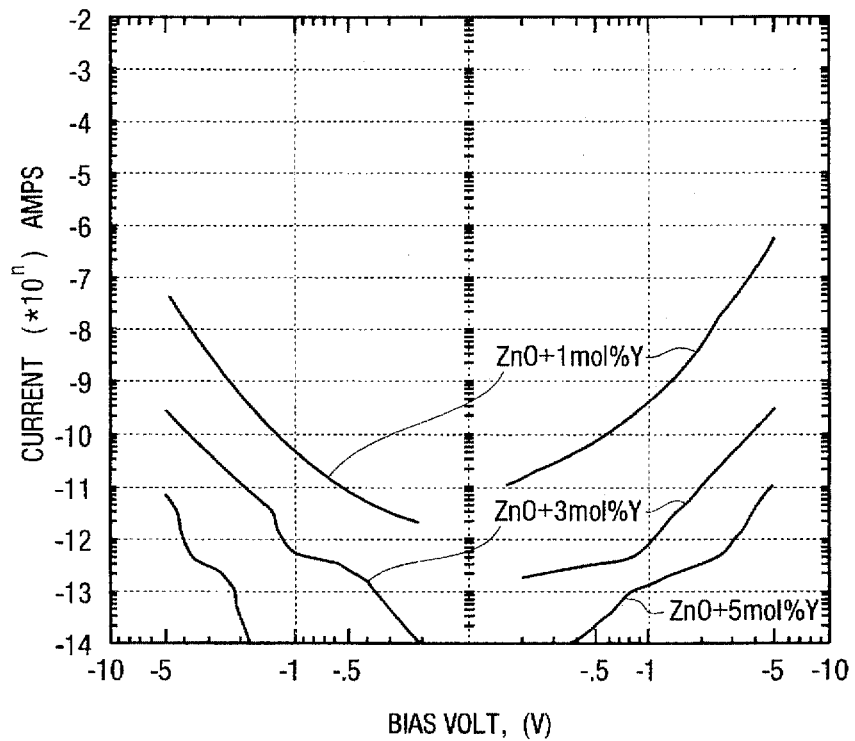
FIG. 3 is a plot depicting current measurement results that were obtained from zinc oxide varistor samples doped to various concentrations with yttrium moieties, wherein amperage (Y axis) is plotted against log(voltage) (X axis)

FIG. 3 depicts results obtained for the yttrium-doped zinc oxide materials. As can be observed, the one, three, and five mole percent samples had very stable current-voltage characteristics, and the zinc oxide film was not electrically destroyed when a five volt differential was applied. Additionally, the overall resistance of the zinc oxide films increased with the increasing yttrium concentration. In fact, the increasing level of electrical resistance was too high for use in some electric devices. Among these three curves, the ZnO+1 mol % Y curve provided the highest N value of about 3.8. The ZnO+3% Y provided the lowest N value of about 1.8. A 5% Y concentration served to raise the N value to about 2.7.

Figure 4:
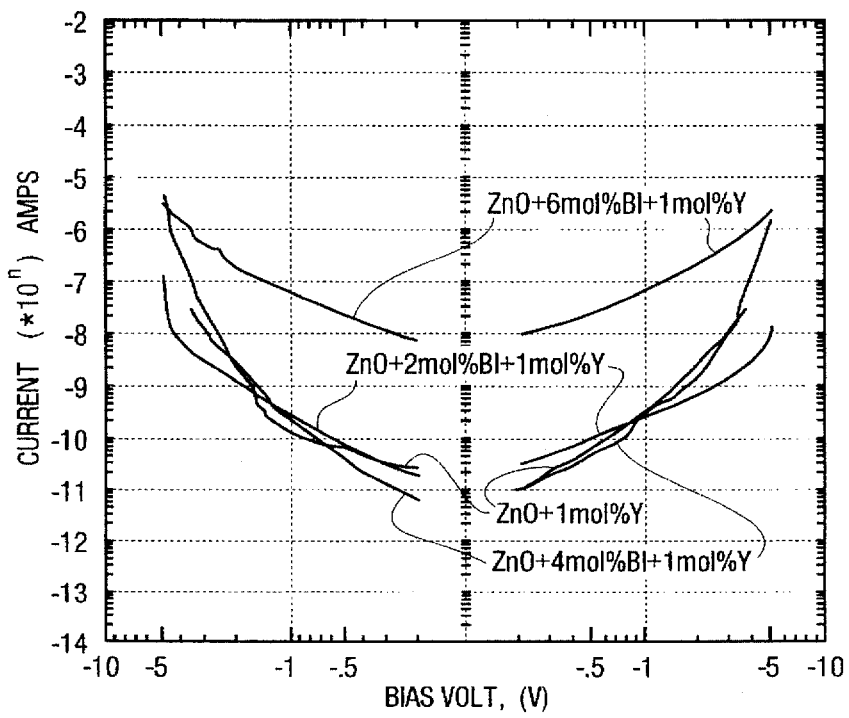
FIG. 4 is a plot similar to that of FIG. 3, but depicting results that were obtained from zinc oxide samples doped with 1 percent yttrium in combination with various bismuth moieties.

FIG. 4 depicts results obtained from the samples including one mole percent yttrium in addition to a bismuth moiety. It is significant that the two and four mole percent bismuth samples demonstrated only slight differences in current-voltage characteristics, but the six percent bismuth-doped sample demonstrated a significant change with respect to the pure one mole percent yttrium-doped sample. The ZnO+4 mol % Bi+1 mol % Y curve provided an N value of about 4.4, whereas the 2% and 6% Bi curves had N values ranging from about 1.2 to 1.4.

Figure 5:
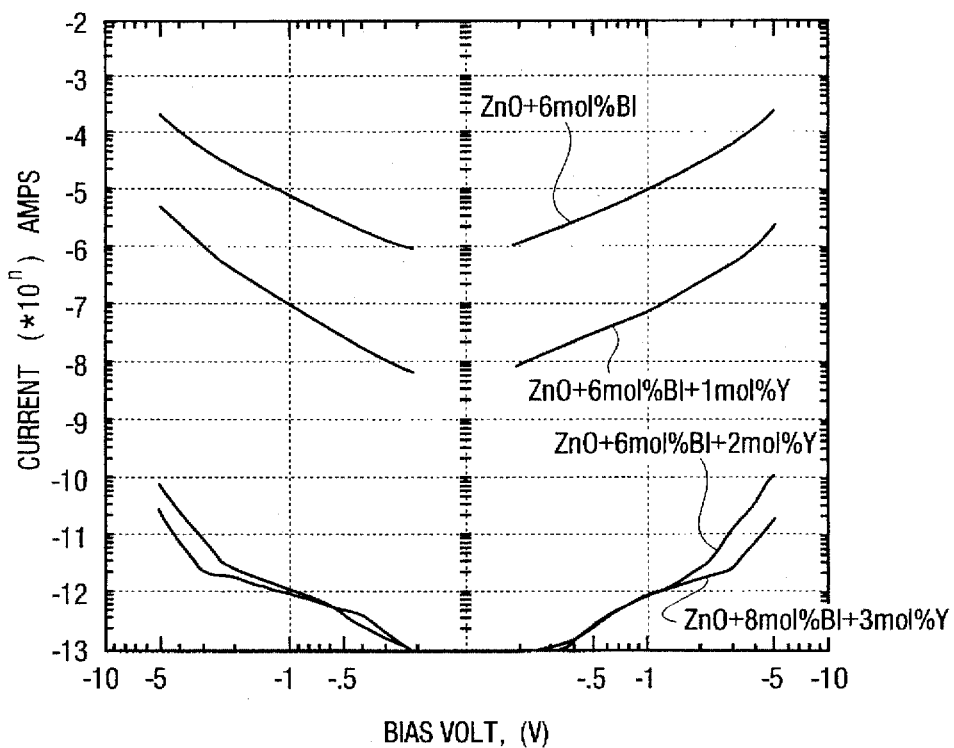
FIG. 5 is a plot similar to that of FIG. 3, but depicting results that were obtained from zinc oxide samples doped with 6 mole percent bismuth in addition to various yttrium moieties.

FIG. 5 depicts results obtained from the samples including six mole percent bismuth in addition to various yttrium dopant moieties. If the yttrium concentration exceeds about two mole percent, then the film resistance again becomes too high for use in some electrical devices. Even so, the resistance of the six mole percent bismuth-doped zinc oxide sample may be adjusted to various levels by the addition of yttrium. Without yttrium, the N value was about 1.2. The addition of 1% to 3% yttrium raised the corresponding N value to fall within a range from about 1.8 to 2.0.

Figure 6:
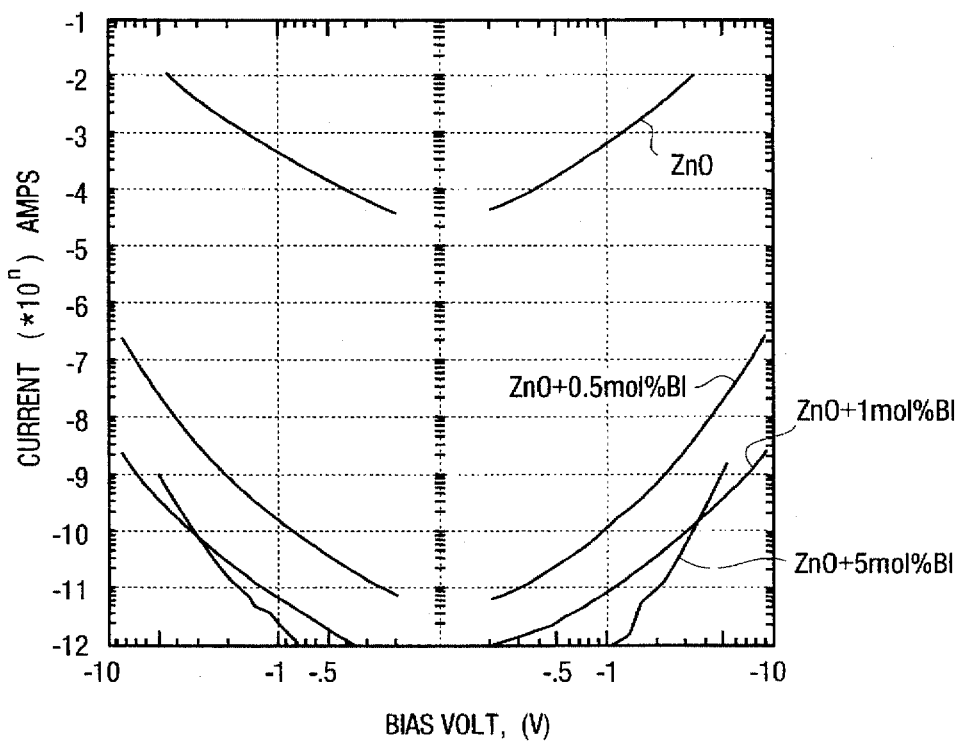
FIG. 6 is a plot similar to that of FIG. 3, but depicting results that were obtained from zinc oxide samples doped with 6 mole percent bismuth in addition to various yttrium moieties.

FIG. 6 depicts results obtained from the samples having various bismuth dopant moieties. Resistance increased with the bismuth concentration, but it is significant that the addition of five percent bismuth drastically altered the exponential component of the curve. The N values varied as 2.8 for ZnO, 3.6 for ZnO+0.5 mol % Bi, 2.0 for ZnO+1 mol % Bi, and 5 for 5 mol % Bi.

The results of FIGS. 3–6 demonstrate that the exponent N of Formula (1) is greater than one. This exponent is typically at least 1.2, and can be five or greater. For example, in FIG. 4, the ZnO+4 mol % Bi+1 mol % Y curve has an N value of about 4.4. In FIG. 5, the ZnO+6 mol % Bi curve has an N value of about 1.2. The ZnO+5 mol % Bi curve of FIG. 6 has an N value of about 5. These values may be adjusted by the addition of dopants as indicated.

The drawings and examples that are described above are provided to illustrate preferred embodiments of the present invention. Accordingly, these drawings and examples also serve to illustrate other forms of the invention including at least the addition of other features such as multiple layers intermediate electrodes 16 and 20. These additional features, for example, can include layers of ferroelectric material and additional electrodes. Other variations can include various geometric constructions, such as contact holes through barrier layer 14 or electrode 20 for placing nonohmic layer 18 in contact with other circuit elements.

Those skilled in the art will understand that the preferred embodiments, as described hereinabove, may be subjected to apparent modifications without departing from the true scope and spirit of the invention. Accordingly, the inventors hereby state their intention to rely upon the Doctrine of Equivalents, in order to protect their full rights in the invention.

We claim:

1. A thin-film varistor, comprising:

a substrate having a first electrode, a second electrode, and a non-ohmic layer interposed between said first electrode and said second electrode, said nonohmic layer having a thickness ranging from 50 nanometers to 500 nanometers, said nonohmic layer including a zinc oxide and yttrium dopant.

2. The varistor as set forth in claim 1, said nonohmic layer including a nonohmic material having electrical properties obeying a formula $$I=(V/C)^N,$$

wherein I is current flowing through the element, C is a constant, V is voltage, and N is a non-ohmic exponent.

3. The varistor as set forth in claim 2, wherein N is at least about 1.2.

4. The varistor as set forth in claim 1, said nonohmic material including a zinc oxide portion as a majority portion of said nonohmic material.

5. The varistor as set forth in claim 4, said nonohmic layer further including a second dopant selected from a group consisting of bismuth, praseodymium, cobalt, antimony, manganese, silicon, chromium, titanium, potassium, dysprosium, cesium, cerium, iron, and mixtures thereof.

6. The varistor as set forth in claim 4, said nonohmic layer having an average grain diameter less than about 200 nanometers.

7. The varistor as set forth in claim 4, said varistor including a bismuth moiety, and a second dopant selected from a group consisting of praseodymium, cobalt, antimony, manganese, silicon, chromium, titanium, potassium, dysprosium, cesium, cerium, iron, and mixtures thereof.

8. The varistor as set forth in claim 1 wherein said yttrium dopant has a concentration ranging from one to five mole percent.

* * * * *